(12) United States Patent
Takahashi et al.

(10) Patent No.: US 8,553,483 B2
(45) Date of Patent: Oct. 8, 2013

(54) SEMICONDUCTOR MEMORY DEVICE

(75) Inventors: Hiroyuki Takahashi, Kanagawa (JP); Masahiro Yoshida, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/602,878

(22) Filed: Sep. 4, 2012

(65) Prior Publication Data
US 2012/0327733 A1 Dec. 27, 2012

Related U.S. Application Data

(62) Division of application No. 12/916,768, filed on Nov. 1, 2010, now Pat. No. 8,279,695.

(30) Foreign Application Priority Data

Nov. 5, 2009 (JP) ................................. 2009-253696
Aug. 25, 2010 (JP) ................................. 2010-188704

(51) Int. Cl.
*G11C 7/00* (2006.01)
*G11C 7/02* (2006.01)
*G11C 7/10* (2006.01)

(52) U.S. Cl.
USPC ........ 365/205; 365/63; 365/154; 365/189.14; 365/189.15; 365/189.16; 365/210.1

(58) Field of Classification Search
USPC ......... 365/154, 155, 156, 63, 189.14, 189.15, 365/189.16, 205, 210.1
See application file for complete search history.

(56) References Cited

U.S. PATENT DOCUMENTS

| | | | |
|---|---|---|---|
| 6,172,919 B1 | 1/2001 | Horikawa | |
| 7,411,850 B2 | 8/2008 | Higashi et al. | |
| 2003/0002370 A1 | 1/2003 | Cowles | |
| 2008/0279019 A1 | 11/2008 | Wang et al. | |

FOREIGN PATENT DOCUMENTS

| | | |
|---|---|---|
| JP | 11-306758 A | 11/1999 |
| JP | 2001-052485 A | 2/2001 |
| JP | 2009-134840 A | 6/2009 |

*Primary Examiner* — Ly D Pham
(74) *Attorney, Agent, or Firm* — Foley & Lardner LLP

(57) ABSTRACT

A semiconductor memory device has: memory blocks; and a local bus connected to the memory blocks. Each memory block has: switches respectively provided between bit line pairs and the local bus and each of which is turned ON in response to a selection signal; a dummy local bus; first and second control circuits. The local bus and the dummy local bus are precharged to a first potential before a read operation. In the read operation, the first control circuit outputs the selection signal to a selected switch to electrically connect a selected bit line pair and the local bus, while the second control circuit supplies a second potential lower than the first potential to the dummy local bus. The first control circuit stops outputting the selection signal when a potential of the dummy local bus is decreased to a predetermined set potential that is between the first and second potentials.

7 Claims, 12 Drawing Sheets

SEMICONDUCTOR MEMORY DEVICE

CROSS-REFERENCE TO RELATED PATENT APPLICATIONS

Japan Priority Application 2009-253696, filed Nov. 5, 2009 including the specification, drawings, claims and abstract, is incorporated herein by reference in its entirety. Japan Priority Application 2010-188704, filed Aug. 25, 2010 including the specification, drawings, claims and abstract, is incorporated herein by reference in its entirety. This application is a Divisional of U.S. application Ser. No. 12/916,768, filed Nov. 11, 2010, incorporated herein by reference in its entirety.

BACKGROUND OF THE INVENTION

1. Field of the Invention

The present invention relates to a semiconductor memory device that writes/reads data to/from a memory cell.

2. Description of Related Art

FIG. 1 illustrates a configuration of a DRAM (Dynamic Random Access Memory) as a conventional semiconductor memory device. The semiconductor memory device is provided with: a memory cell array in which memory cells 20 are arranged in a matrix form; a plurality of word lines WL that are arranged in a row direction of the memory cell array; a plurality of bit line pairs BL and BL$^-$ ("$^-$" means logical negation, and is called a "bar") that are provided in a column direction of the memory cell array; a plurality of sense amplifiers 103; a plurality of transistors 104a and 104b, local buses 105-1 and 105-2; a data amplifier 106; a bus 7; and a data input/output circuit 8.

The plurality of sense amplifiers 103 are respectively provided associated with the plurality of bit line pairs BL and BL$^-$. The plurality of transistors 104-a and 104-b are respectively provided between the plurality of bit line pairs BL and BL$^-$ and the local buses 105-1 and 105-2. The plurality of transistors 104-a and 104-b each is an N-type MOSFET (N-channel Metal Oxide Semiconductor Field Effect Transistor).

The local buses 105-1 and 105-2 are, before a read operation and a write operation, precharged to a potential VDD that is a power source potential.

The memory cell 20 has an N-type MOSFET 21 and a capacitive element 22. A gate of the N-type MOSFET 21 is connected to the word line WL, and a drain thereof is connected to the bit line BL or BL$^-$. A source of the N-type MOSFET 21 is connected to one terminal of the capacitive element 22. The other terminal of the capacitive element 22 is grounded.

The sense amplifier 103 is provided with: P-type MOSFETs 31 and 33 and N-type MOSFETs 32 and 34 for constituting a flip-flop; and an N-type MOSFET 35. A source of the P-type MOSFET 31 is supplied with a potential SAP that is between the potential VDD and a ground potential GND, and a drain thereof is connected to the bit line BL. A source of the N-type MOSFET 32 is supplied with a potential SAN that is between the potential SAP and the ground potential GND, a drain thereof is connected to the drain of the P-type MOSFET 31, and a gate thereof is connected to a gate of the P-type MOSFET 31. A source of the P-type MOSFET 33 is supplied with the potential SAP, a drain thereof is connected to the gates of the P-type MOSFET 31 and the N-type MOSFET 32 and the bit line BL$^-$, and a gate thereof is connected to the drains of the P-type MOSFET 31 and the N-type MOSFET 32. A source of the N-type MOSFET 34 is supplied with the potential SAN, a drain thereof is connected to the drain of the P-type MOSFET 33, and a gate thereof is connected to the gate of the P-type MOSFET 33. A source of the N-type MOSFET 35 is grounded. A drain of the N-type MOSFET 35 is supplied with the potential SAN, and a gate thereof is supplied with an enable signal SAE.

FIG. 2 is a timing chart showing the read operation.

First, a decoded row address specifies one word line WL (selected word line WL) out of the plurality of word lines WL. In this case, the selected word line WL is supplied with a word line selection signal. At this time, a level of the word line selection signal is the high level "H".

At the same time, a decoded row address specifies one bit line pair BL and BL$^-$ (selected bit line pair BL and BL$^-$) out of the plurality of bit line pairs BL and BL$^-$. In this case, the sense amplifier 103 that is provided associated with the selected bit line pair BL and BL$^-$ among the plurality of sense amplifiers 103 is supplied with the enable signal SAE. At this time, a level of the enable signal SAE is the high level "H".

Also, gates of selected transistor 104-a and 104-b that are provided associated with the selected bit line pair BL and BL$^-$ among the plurality of transistors 104-a and 104-b are supplied with a selection signal YSW. At this time, a level of the selection signal YSW is the high level "H".

The N-type MOSFET 35 of the selected sense amplifier 103 is turned ON in response to the enable signal SAE "H". The selected transistors 104-a and 104-b are turned ON in response to the selection signal YSW "H", and thus the selected bit line pair BL and BL$^-$ and the local buses 105-1 and 105-2 are electrically connected with each other. At this time, a data is read out from a selected memory cell 20 that is connected to the selected word line WL and one bit line of the selected bit line pair BL and BL$^-$, and a potential difference is generated between the selected bit line pair BL and BL$^-$. The selected sense amplifier 103 supplies the potential difference to the local buses 105-1 and 105-2 through the selected transistors 104-a and 104-b. The data amplifier 106 supplies the potential difference supplied to the local buses 105-1 and 105-2 to the bus 7. The data input/output circuit 8 outputs, as a read data, the potential difference supplied to the bus 7.

Next, the level of the enable signal SAE is switched from the high level "H" to the low level "L". Also, the level of the word line selection signal is switched from the high level "H" to the low level "L". At this time, the local buses 105-1 and 105-2 are precharged to the potential VDD.

FIG. 3 is a timing chart showing the write operation.

First, a decoded row address specifies one word line WL (selected word line WL) out of the plurality of word lines WL. In this case, the selected word line WL is supplied with a word line selection signal. At this time, the level of the word line selection signal is the high level "H".

At the same time, a decoded row address specifies one bit line pair BL and BL$^-$ (selected bit line pair BL and BL$^-$) out of the plurality of bit line pairs BL and BL$^-$. In this case, gates of the selected transistors 104-a and 104-b that are respectively provided associated with the selected bit line pair BL and BL$^-$ among the plurality of transistors 104-a and 104-b are supplied with the selection signal YSW. The level of the selection signal is the high level "H".

The selected transistors 104-a and 104-b are turned ON in response to the selection signal YSW "H", and thus the selected bit line pair BL and BL$^-$ and the local buses 105-1 and 105-2 are electrically connected with each other.

The data input/output circuit 8 supplies a write data to the bus 7. The data amplifier 106 supplies the write data supplied to the bus 7 to the selected bit line pair BL and BL$^-$ through the local buses 105-1 and 105-2 and the selected transistors 104-*a* and 104-*b*. At this time, the write data is written to a selected memory cell 20 connected to the selected word line WL and one bit line (e.g., the bit line BL) of the selected bit line pair BL and BL⁻.

Next, the level of the word line selection signal is switched from the high level "H" to the low level "L". At this time, the local buses 105-1 and 105-2 are precharged to the potential VDD.

In order to write the data to the memory cell 20 in the write operation, the data amplifier 106 needs to drive not only the local buses 105-1 and 105-2 but also the selected bit line pair BL and BL through the selected transistors 104-*a* and 104-*b* to invert the data latched by the selected sense amplifier 103. It is therefore necessary to ensure a sufficiently long period of time for which the local buses 105-1 and 105-2 and the selected bit line pair BL and BL⁻ are electrically connected with each other. In other words, it is required to ensure a sufficiently long period of time for which the selection signal YSW "H" is supplied to the selected transistors 104-*a* and 104-*b*.

Whereas, in the read operation, a period of time during which the local buses 105-1 and 105-2 and the bit line pair BL and BL⁻ are electrically connected with each other may be the same as that in the write operation.

In the read operation, assuming that a potential difference necessary for determining data of the selected memory cell 20 is denoted by $V_O$, the potential difference between the local buses 105-1 and 105-2 is just required to become $V_O$. Therefore, the period of time during which the local buses 105-1 and 105-2 and the selected bit line pair BL and BL⁻ are electrically connected with each other may need not be as long as that in the write operation. For example, according to a technique described in Japanese Patent Publication JP-H11-306758, a period of time during which a data line pair and a bit line pair are connected with each other in the read operation is made shorter than that in the write operation, and speeding-up is achieved.

SUMMARY

However, the technique described in Japanese Patent Publication JP-H11-306758 cannot achieve speeding-up of an eDRAM (Embedded DRAM), although it may achieve speeding-up of a DRAM. The reason is as follows.

The eDRAM is provided with: a plurality of memory blocks each having the above-described memory cell array, sense amplifiers and transistors; and local buses connected to the plurality of memory blocks. In the case of such a configuration, the local bus is longer as compared with the case of a DRAM. Therefore, in the read operation, the period of time during which the selection signal YSW "H" is supplied to the selected transistors 104-*a* and 104-*b* cannot be simply shortened. It is desired to achieve speeding-up even in such a configuration.

In one embodiment of the present invention, a semiconductor memory device is provided. The semiconductor memory device has: a plurality of memory blocks; and a local bus connected to the plurality of memory blocks and which is precharged to a first potential before a read operation and a write operation. Each of the plurality of memory blocks has: a memory cell array in which memory cells are arranged in a matrix form; a plurality of bit line pairs arranged in a column direction of the memory cell array; a plurality of switches respectively provided between the plurality of bit line pairs and the local bus and each of which is turned ON in response to a selection signal; a first control circuit configured to, in the read operation and the write operation, output the selection signal to a selected switch of the plurality of switches so as to electrically connect a selected bit line pair of the plurality of bit line pairs and the local bus; a dummy local bus which is precharged to the first potential before the read operation; and a second control circuit configured to, in the read operation, supply a second potential lower than the first potential to the dummy local bus in response to the selection signal. In the read operation, the first control circuit stops outputting the selection signal when a potential of the dummy local bus is decreased from the first potential to a predetermined set potential that is between the first potential and the second potential.

According to the semiconductor memory device of the present invention, speeding-up can be achieved in a read operation, even in the case of the eDRAM configuration. The reason is as follows.

In the case of the eDRAM, the length of the local bus is greater than that of the DRAM. Therefore, the dummy local bus is provided in each of the plurality of memory blocks, and the dummy local bus is precharged to the first potential. In the read operation, the selection signal is output to the selected switches of the specified memory block, and also the second potential is supplied to the dummy local bus of the specified memory block. Here, let us consider a case where a potential difference necessary for determining the read data from the selected memory cell is $V_O$. In this case, the potential difference between the local buses just needs to be $V_O$. Therefore, when the potential of the dummy local bus is decreased from the first potential to the predetermined set potential Vst (Vst=VDD−V, V>$V_O$) in the period of time t1 (t2<t1<t3), the outputting of the selection signal (YSW1 "H") is stopped. In this manner, according to the semiconductor memory device of the present invention, the period of time during which the local buses and the selected bit line pair are electrically connected with each other in the read operation is shortened as compared with a case of the write operation. Thus, speeding-up can be achieved in a read operation, even in the case of the eDRAM configuration.

Moreover, according to the semiconductor memory device of the present invention, power consumption on charging/discharging the local buses in the read operation can be reduced. The reason is as follows.

In the read operation, the local bus is discharged to generate the potential difference $V_O$ that is necessary for determining the read data from the selected memory cell. After that, the local bus is precharged to the first potential. In a case where the period of time during which the local buses and the selected bit line pair are electrically connected with each other in the read operation is the same as that in the write operation, the potential difference between the local buses due to the discharging becomes equal to a potential difference Vw generated in a period from the start of the read operation to the stop of the output of the selection signal (YSW1"H"), i.e., the charging/discharging is performed just by an amount of the potential difference Vw. On the other hand, in the case where the period of time during which the local buses and the selected bit line pair are electrically connected with each other in the read operation is shorter than that in the write operation, the potential difference between the local buses due to the discharging becomes equal to a potential difference Vr (Vr<Vw) generated in a period from the start of the read operation to the stop of the output of the selection signal (YSW1"H"), i.e., the charging/discharging is performed just by an amount of the potential difference Vr. The potential difference Vr is smaller than the potential difference Vw. Therefore, according to the semiconductor memory device of the present invention, the power consumption on charging/ discharging the local buses in the read operation can be reduced, by setting the period of time during which the local buses and the selected bit line pair are electrically connected with each other in the read operation shorter than that in the write operation.

Furthermore, according to the semiconductor memory device of the present invention, noise on the local buses can be reduced. The reason is as follows.

An amount of noise occurring on the local buses due to the charging/discharging of the local buses is proportional to a width of the local bus (local bus width). However, in the case of the eDRAM, the local bus width is larger than that in the case of the DRAM, and hence the noise also is increased as compared with the case of the DRAM. By reducing the power consumption on charging/discharging the local buses, the noise on the local buses can be reduced.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
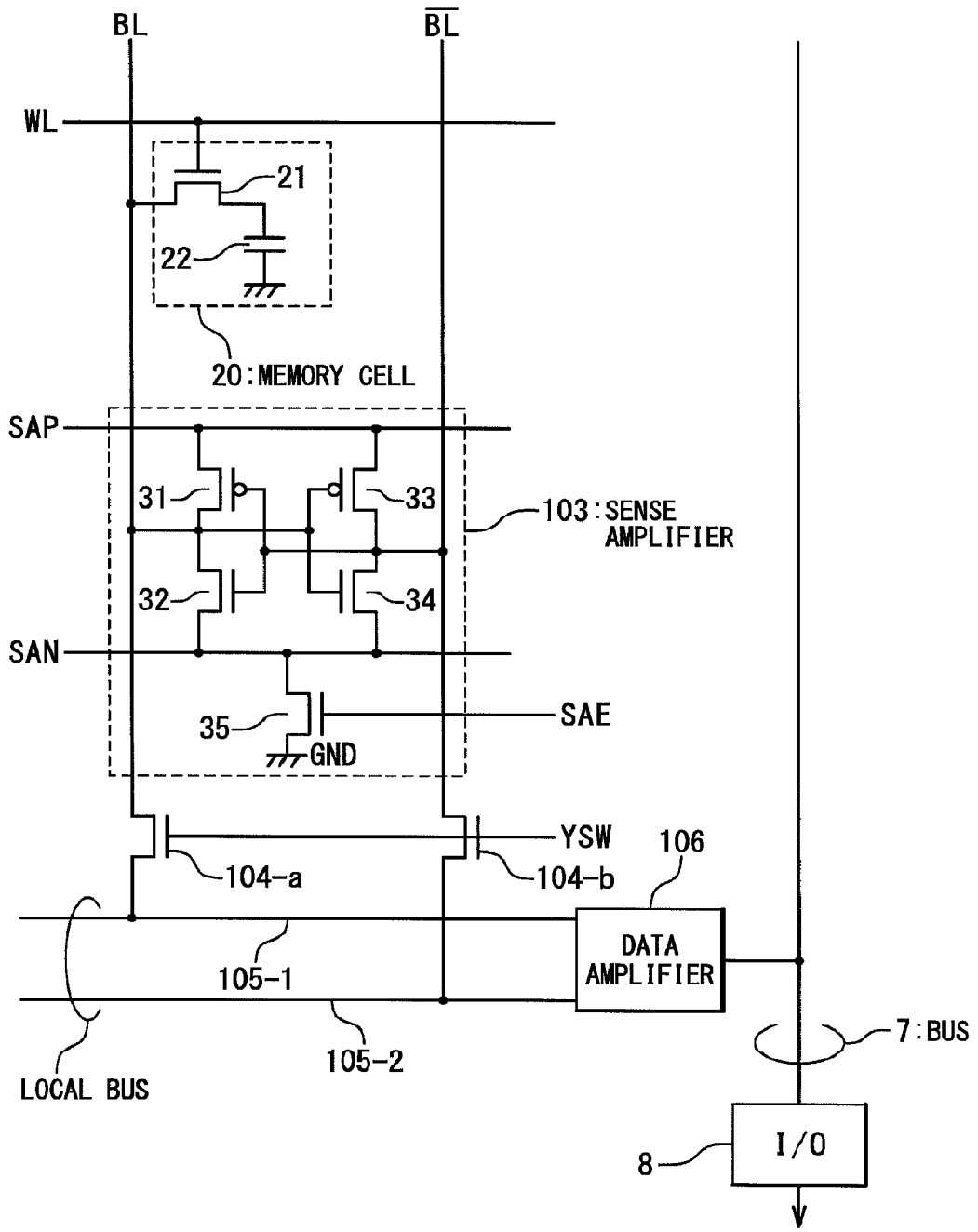
FIG. 1 illustrates a configuration of a typical DRAM (Dynamic Random Access Memory) as a semiconductor memory device.
Figure 2:
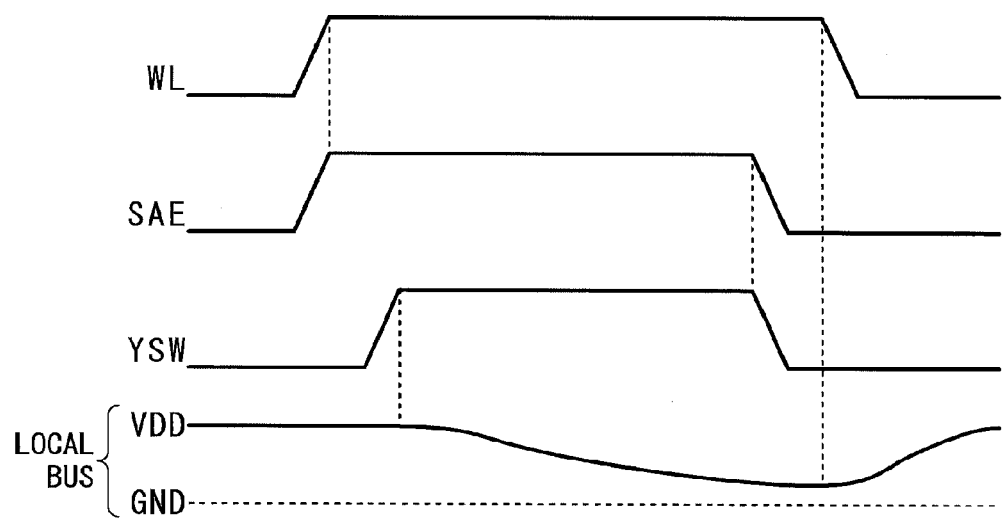
FIG. 2 is a timing chart showing a read operation.
Figure 3:
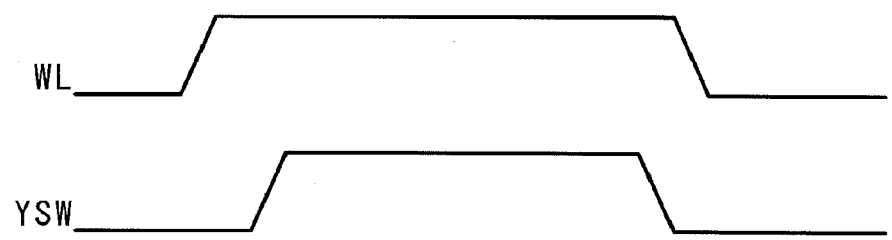
FIG. 3 is a timing chart showing a write operation.
Figure 4:
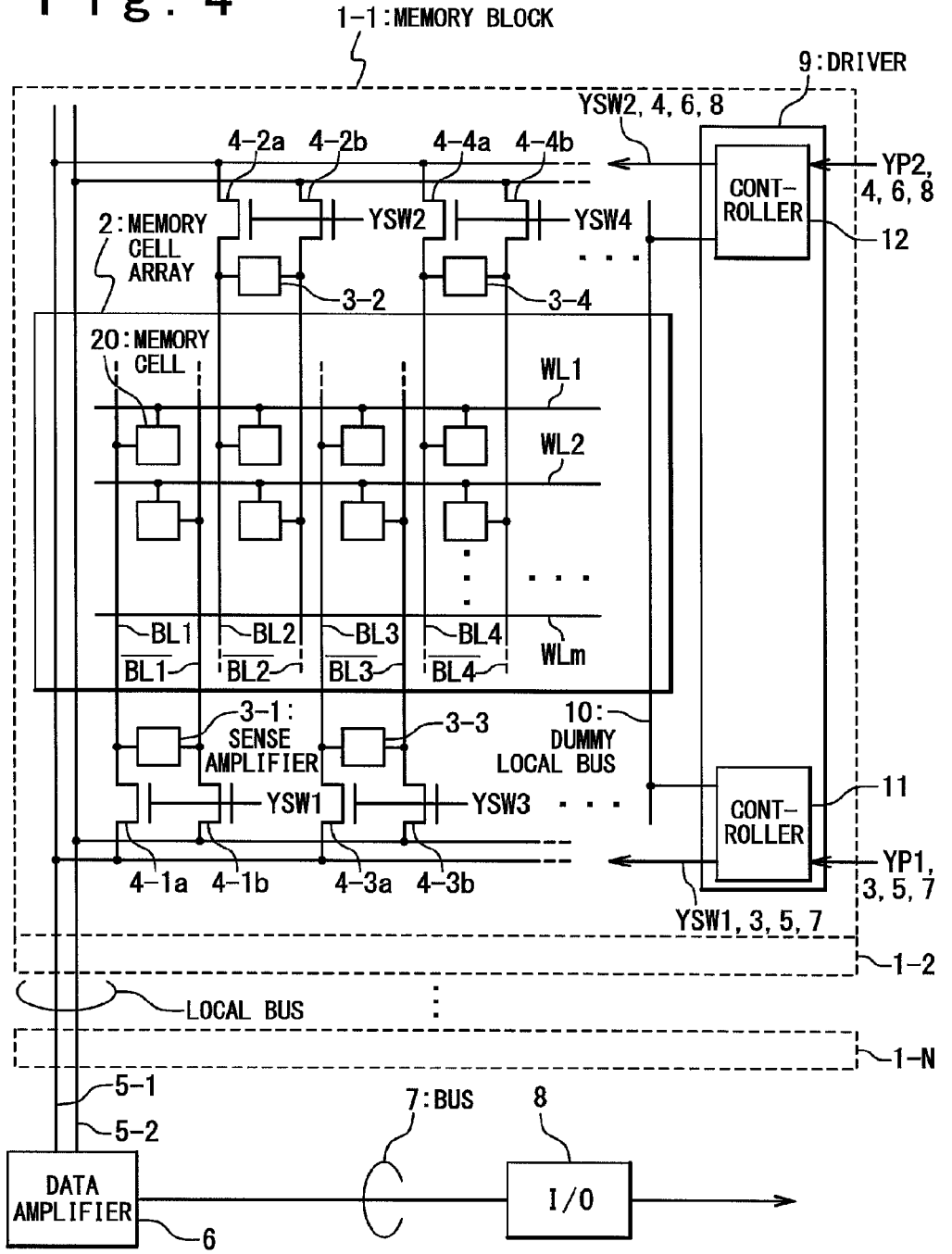
FIG. 4 illustrates a configuration of an eDRAM (Embedded DRAM) as a semiconductor memory device according to an embodiment of the present invention.

FIG. 4 illustrates a configuration of an eDRAM (Embedded DRAM) as a semiconductor memory device according to an embodiment of the present invention.

The semiconductor memory device according to the embodiment of the present invention is provided with a plurality of memory blocks 1-1 to 1-N (N is an integer equal to or more than 2), local buses 5-1 and 5-2, a data amplifier 6, a bus 7, and a data input/output circuit 8.

The plurality of memory blocks 1-1 to 1-N are connected to the local buses 5-1 and 5-2 in common. The data amplifier 6 is connected to the local buses 5-1 and 5-2 and the bus 7. The data input/output circuit 8 is connected to the bus 7.

The local buses 5-1 and 5-2 are, before a read operation and a write operation, precharged to a potential VDD that is a power source potential.

Each of the plurality of memory blocks 1-1 to 1-N is provided with: a memory cell array 2 in which memory cells 20 are arranged in a matrix form; a plurality of word lines WL1 to WLm (m is an integer equal to or more than 2) that are arranged in a row direction of the memory cell array 2; a plurality of bit line pairs BL1 and BL1$^-$, ..., BL8 and BL8$^-$ ("$^-$" means logical negation, and is called a "bar") that are provided in a column direction of the memory cell array 2; a plurality of sense amplifiers 3-1 to 3-8; a plurality of transistors (switches) 4-1a, 4-1b, ..., 4-8a and 4-8b; a driver 9; and a dummy local bus 10.

The plurality of sense amplifiers 3-1 to 3-8 are respectively provided associated with the plurality of bit line pairs BL1 and BL1$^-$, ..., BL8 and BL8$^-$. The plurality of transistors 4-1a, 4-1b, ..., 4-8a and 4-8b are respectively provided between the plurality of bit line pairs BL1 and BL1$^-$, ..., BL8 and BL8$^-$ and the local buses 5-1 and 5-2. Each of the plurality of transistors (switches) 4-1a, 4-1b, ..., 4-8a and 4-8b is an N-type MOSFET (N-channel Metal Oxide Semiconductor Field Effect Transistor).

The sense amplifier has a larger number of transistors and thus a larger circuit size as compared with the memory cell 20. If the plurality of sense amplifiers 3-1 to 3-8 are arranged next to each other, an area of each memory block 1 is increased. Therefore, in the example shown in FIG. 4, the odd-numbered sense amplifiers 3-1, ..., 3-7 and transistors 4-1a, 4-1b, ... 4-7a and 4-7b and the even-numbered sense amplifiers 3-2, ..., 3-8 and transistors 4-2a, 4-2b, ..., 4-8a and 4-8b are arranged in a symmetrical manner across the memory cell array 2.

The dummy local bus 10 is arranged in parallel to the local buses 5-1 and 5-2. The dummy local bus 10 is made of the same material as that for the local buses 5-1 and 5-2. The dummy local bus 10 is 1/N times as long as the each local bus 5-1, 5-2. The memory cell array 2 is typically provided with: a memory cell area where the memory cells 20 are arranged; and a peripheral area around the memory cell area. The dummy local buses 10 are provided in the peripheral area. Thus, there is no need to prepare a special space dedicated to the dummy local buses 10, and no overhead is caused.

The dummy local bus 10 is precharged to the potential VDD before the read operation.

The driver 9 is provided with controllers 11 and 12. The controllers 11 and 12 are connected to the dummy local bus 10.

Figure 5:
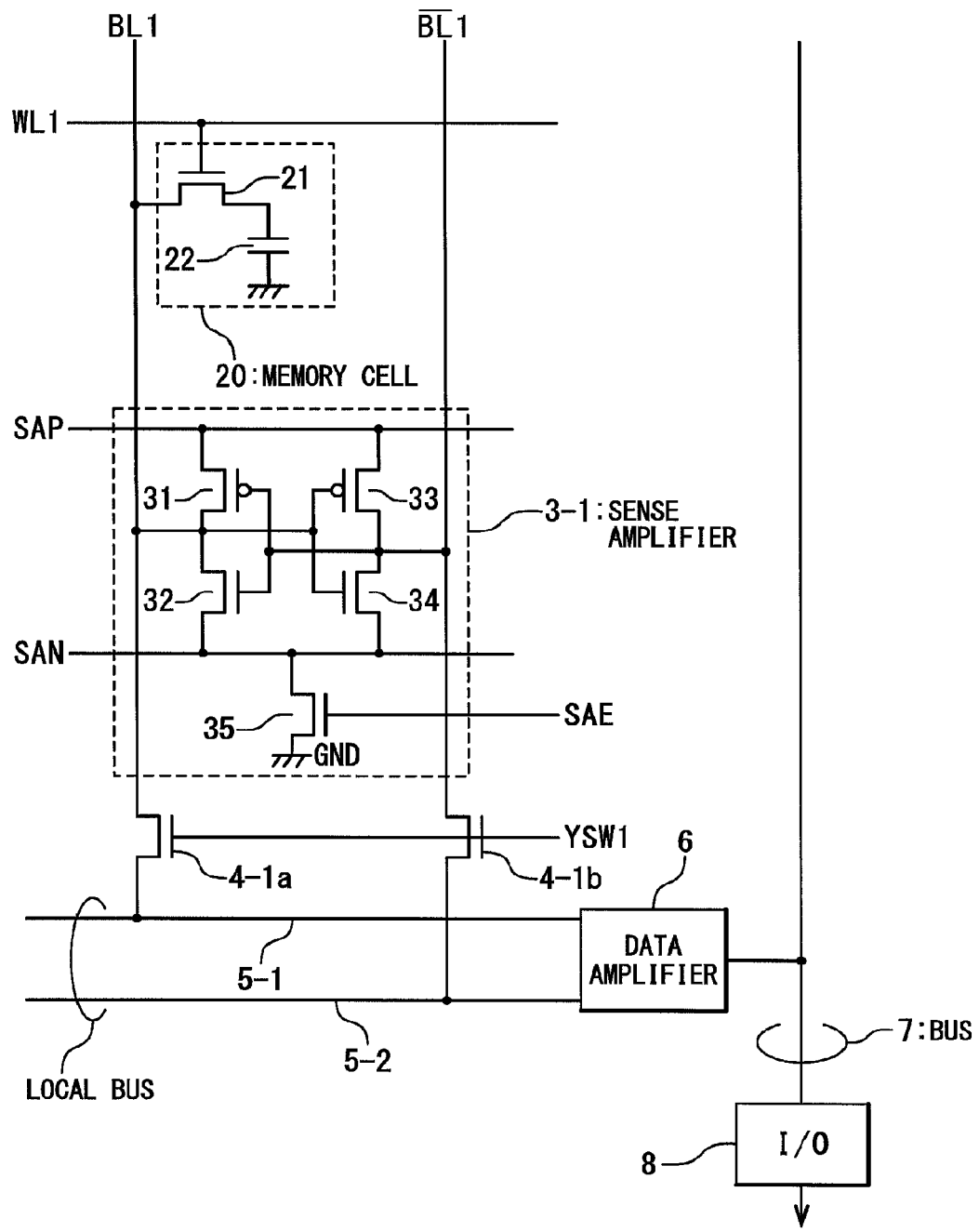
FIG. 5 illustrates a connection relationship among a memory cell array 2 in each memory block (e.g., memory block 1-1) in FIG. 4, each sense amplifier (e.g., sense amplifier 3-1), each transistor pair (e.g., transistors 4-1a and 4-1b), and local buses 5-1 and 5-2, in the semiconductor memory device according to the embodiment of the present invention.

FIG. 5 illustrates a connection relationship among the memory cell array 2 in each of the memory blocks (e.g., memory block 1-1) in FIG. 4, each of the sense amplifiers (e.g., sense amplifier 3-1), each of the transistor pairs (e.g., transistors 4-1a and 4-1b), and the local buses 5-1 and 5-2.

The memory cell 20 has an N-type MOSFET 21 and a capacitive element 22. A gate of the N-type MOSFET 21 is connected to the word line WL, and a drain thereof is connected to the bit line BL1 or BL1$^-$. A source of the N-type MOSFET 21 is connected to one terminal of the capacitive element 22. The other terminal of the capacitive element 22 is grounded.

The sense amplifier 3-1 is provided with: P-type MOSFETs 31 and 33 and N-type MOSFETs 32 and 34 for constituting a flip-flop; and an N-type MOSFET 35. A source of the P-type MOSFET 31 is supplied with a potential SAP that is between the potential VDD and a ground potential GND, and a drain thereof is connected to the bit line BL1. A source of the N-type MOSFET 32 is supplied with a potential SAN that is between the potential SAP and the ground potential GND, a drain thereof is connected to the drain of the P-type MOSFET 31, and a gate thereof is connected to a gate of the P-type MOSFET 31. A source of the P-type MOSFET 33 is supplied with the potential SAP, a drain thereof is connected to the gates of the P-type MOSFET 31 and the N-type MOSFET 32 and the bit line BL1$^-$, and a gate thereof is connected to the drains of the P-type MOSFET 31 and the N-type MOSFET 32. A source of the N-type MOSFET 34 is supplied with the potential SAN, a drain thereof is connected to the drain of the P-type MOSFET 33, and a gate thereof is connected to the gate of the P-type MOSFET 33. A source of the N-type MOSFET 35 is grounded. A drain of the N-type MOSFET 35 is supplied with the potential SAN, and a gate thereof is supplied with an enable signal SAE.

Figure 6A:
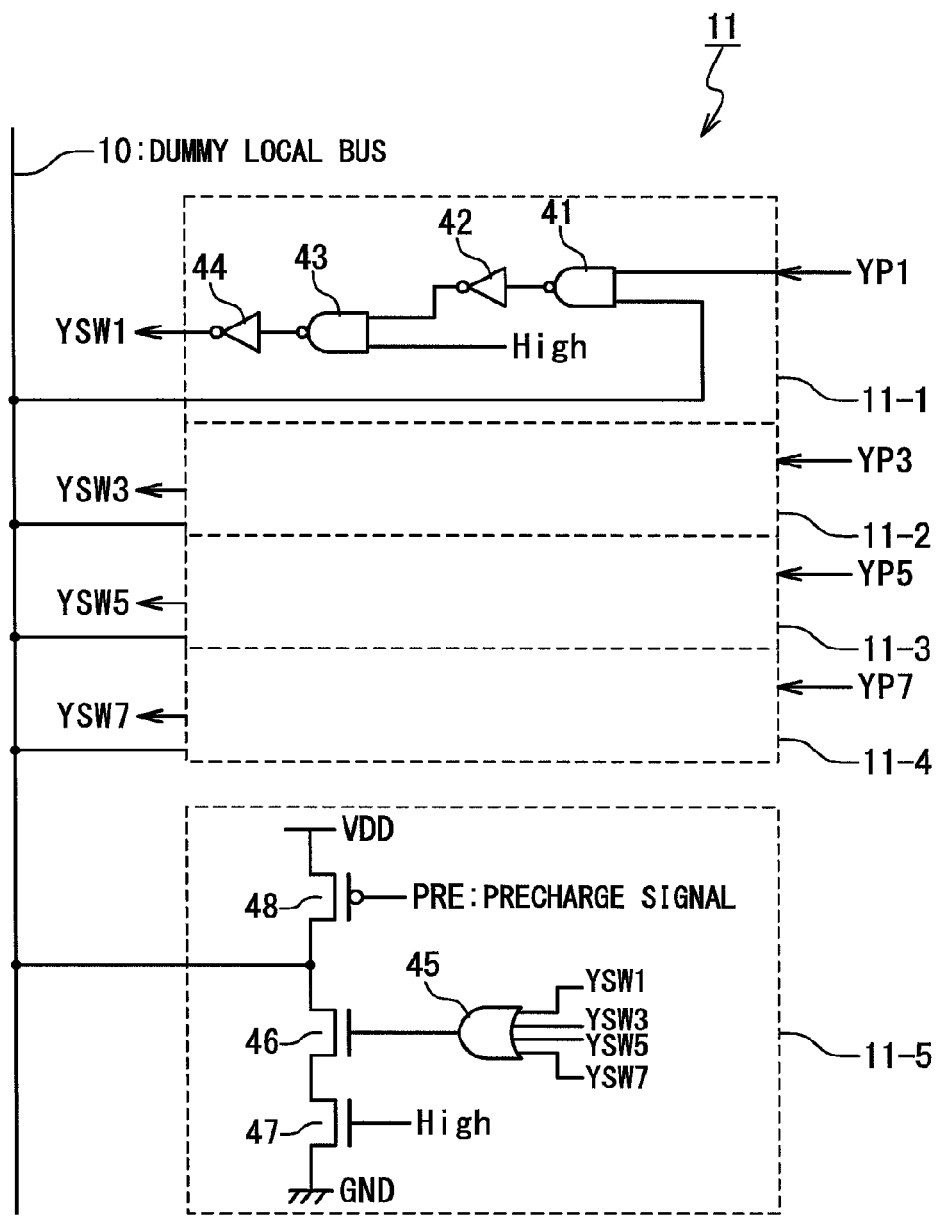
FIG. 6A illustrates a connection relationship between a controller 11 and a dummy local bus 10 in each memory block (e.g., memory block 1-1) in FIG. 4, in the semiconductor memory device according to the embodiment of the present invention.

FIG. 6A illustrates a connection relationship between the controller 11 and the dummy local bus 10 in each of the memory blocks (e.g., memory block 1-1) in FIG. 4.

The controller 11 is provided with control circuits 11-1 to 11-5.

Each of the control circuits 11-1 to 11-4 (first control circuit) is provided with NAND circuits 41 and 43 and inverter circuits 42 and 44.

In the control circuit 11-1, one of two inputs of the NAND circuit 41 is supplied with a signal YP1, and the other input thereof is connected to the dummy local bus 10. An output of the NAND circuit 41 is connected to an input of the inverter circuit 42. One of two inputs of the NAND circuit 43 is connected to an output of the inverter circuit 42, and the other input thereof is always supplied with a high level signal. An output of the NAND circuit 43 is connected to an input of the inverter circuit 44. The inverter circuit 44 outputs the selection signal YSW1.

Similarly, in the control circuits 11-2 to 11-4, signals YP3, YP5 and YP7 are respectively supplied to the one inputs of the NAND circuits 41, and the inverter circuits 44 respectively output selection signals YSW3, YSW5 and YSW7. The connection relationship is the same as in the case of the control circuit 11-1.

The control circuit 11-5 (second control circuit) is provided with an OR circuit 45 and transistors 46 to 48. The transistors 46 and 47 are N-type MOSFETs, and the transistor 48 is a P-type MOSFET.

Figure 7:
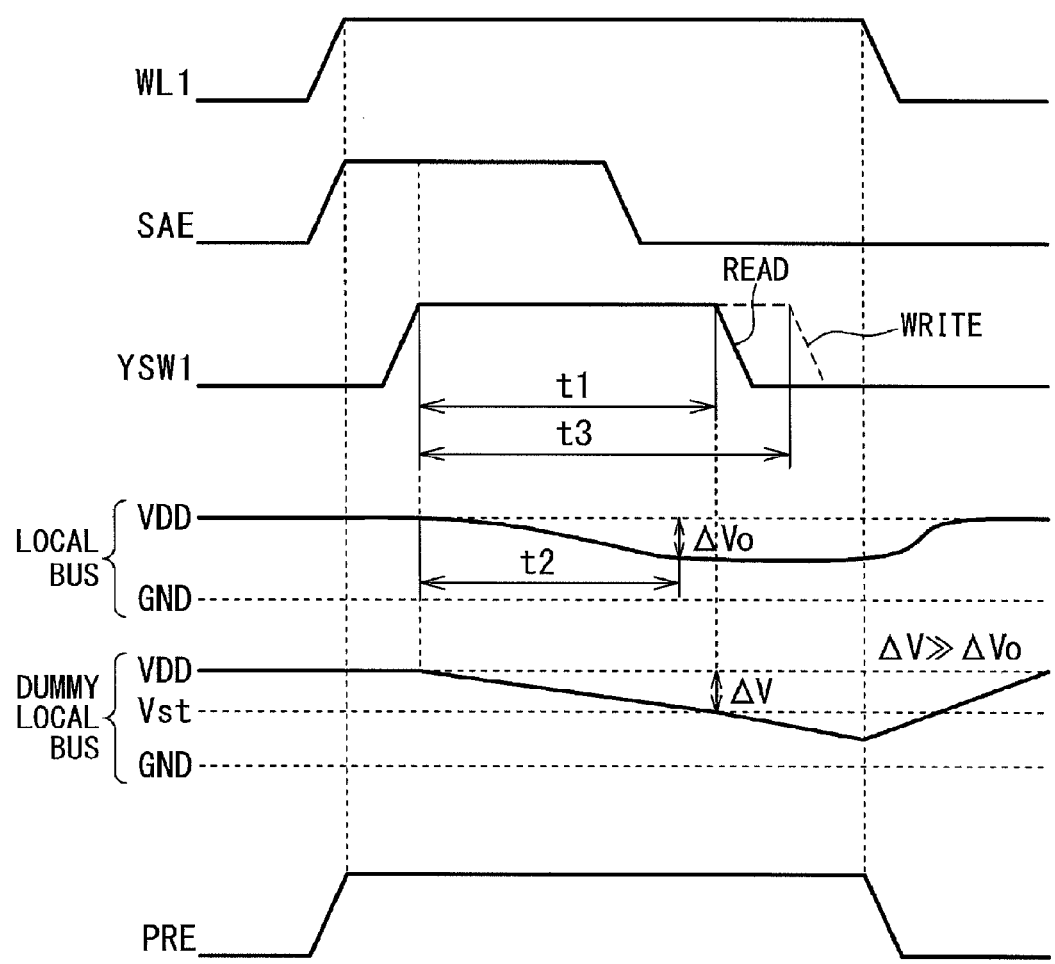
FIG. 7 is a timing chart showing an operation of the semiconductor memory device according to the embodiment of the present invention.

In the control circuit 11-5, the selection signals YSW1, YSW3, YSW5 and YSW7 are supplied to an input of the OR circuit 45. A source of the transistor 48 is supplied with the potential VDD, a drain thereof is connected to the dummy local bus 10, and a gate thereof is supplied with a precharge signal PRE. The transistor 48 is turned ON when a level of the precharge signal PRE is the low level "L". The level of the precharge signal PRE is switched from the low level "L" to the high level "H" during the read operation, and is switched from the high level "H" to the low level "L" after the read operation (see FIG. 7). That is, when the read operation is not performed, the level of the precharge signal PRE is the low level "L". A drain of the transistor 46 is connected to the dummy local bus 10 and the drain of the transistor 48, and a gate thereof is connected to an output of the OR circuit 45. A drain of the transistor 47 is connected to a source of the transistor 46, and a source thereof is supplied with the ground potential GND. A level of a signal supplied to a gate of the transistor 47 is always the high level "H". That is, the transistor 47 is constantly turned ON.

The transistor 47 is of the same type as the N-type transistors 32 and 34 in the flip-flop of the sense amplifier 3-1.

Figure 6B:
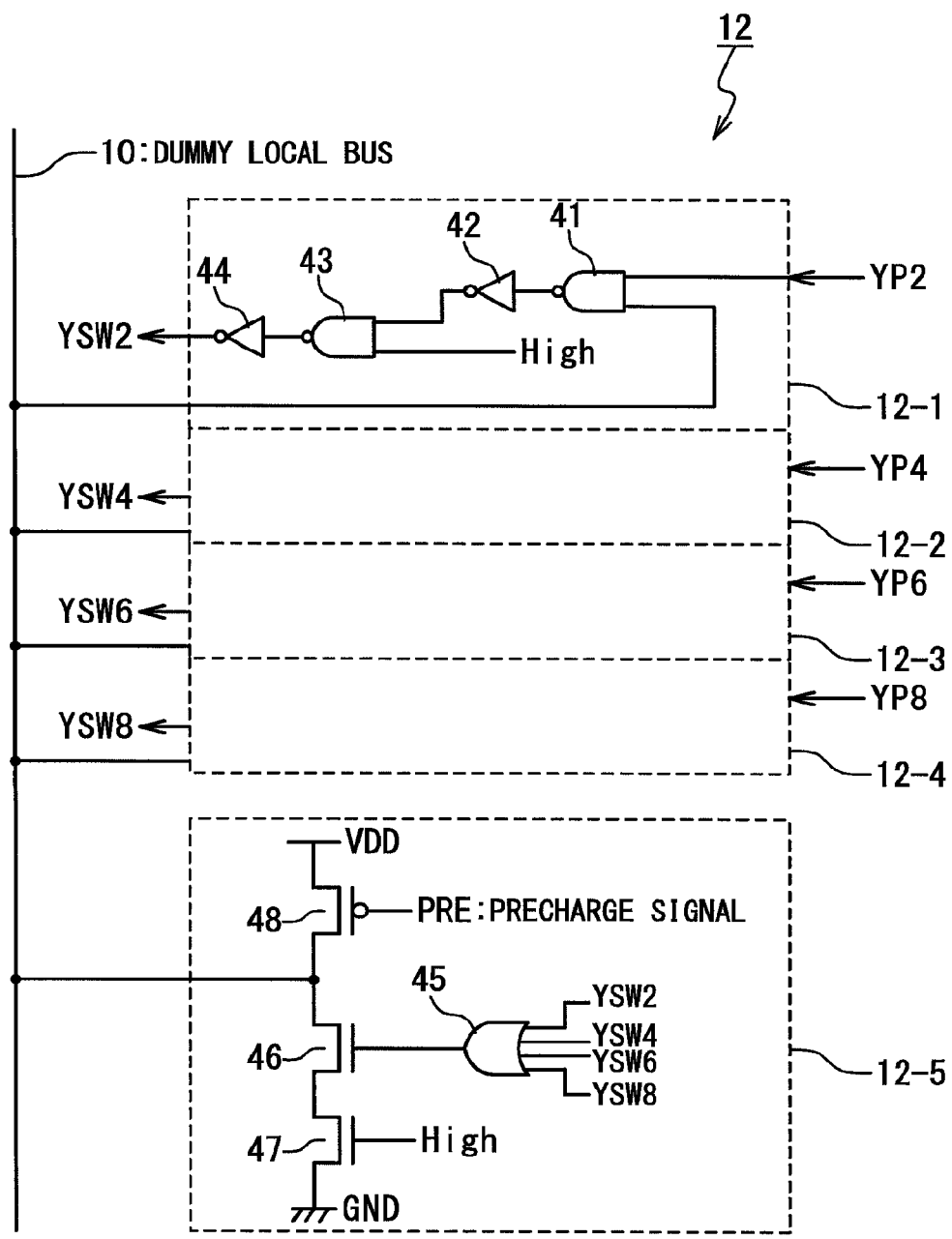
FIG. 6B illustrates a connection relationship between a controller 12 and a dummy local bus 10 in each memory block (e.g., memory block 1-1) in FIG. 4, in the semiconductor memory device according to the embodiment of the present invention.

FIG. 6B illustrates a connection relationship between the controller 12 and the dummy local bus 10 in each of the memory blocks (e.g., memory block 1-1) in FIG. 4.

The controller 12 is provided with control circuits 12-1 to 12-5.

In the control circuits 12-1 to 12-4 (first control circuit), signals YP2, YP4, YP6 and YP8 are respectively supplied to the one inputs of the NAND circuits 41, and the inverter circuits 44 respectively output selection signals YSW2, YSW4, YSW6 and YSW8. The connection relationship is the same as in the case of the control circuits 11-1 to 11-4.

In the control circuit 12-5 (second control circuit), the selection signals YSW2, YSW4, YSW6 and YSW8 are supplied to an input of the OR circuit 45. The connection relationship is the same as in the case of the control circuit 11-5.

According to the present embodiment, the period of time during which the local buses 5-1 and 5-2 and the selected bit line pair BL1 and BL1$^-$ are electrically connected with each other is designed to be different between the read operation and the write operation. The reason will be described with reference to FIG. 7.

Here, let us consider a case where the memory block 1-1 is selected (specified) from the plurality of memory blocks 1-1 to 1-N in the read operation and the write operation. Also, the word line WL1 is selected from the plurality of word lines WL1 to WLm, by a decoded row address. Also, the bit line pair BL1 and BL1$^-$ is selected from the plurality of bit line pairs BL1 and BL1$^-$, ..., BL8 and BL8$^-$, by a decoded column address. In this case, the transistors (switches) 4-1a and 4-1b are selected from the plurality of transistors 4-1a, 4-1b, ..., 4-8a and 4-8b, by the decoded column address, i.e., the selection signal YSW1 "H" is supplied to the transistors 4-1a and 4-1b. Also, in the read operation, the sense amplifier 3-1 is selected from the plurality of sense amplifiers 3-1 to 3-8, and the enable signal SAE "H" is supplied to the sense amplifier 3-1.

In order to write the data to the memory cell 20 in the write operation, the data amplifier 6 needs to drive not only the local buses 5-1 and 5-2 but also the selected bit line pair BL1 and BL1⁻ through the selected transistors 4-1a and 4-1b to invert the data latched by the selected sense amplifier 3-1. It is therefore necessary to ensure a sufficiently long period of time during which the local buses 5-1 and 5-2 and the selected bit line pair BL1 and BL1⁻ are electrically connected with each other. In other words, it is required to ensure a sufficiently long period of time during which the selection signal YSW1 "H" is supplied to the selected transistors 4-1a and 4-1b.

Whereas, in the read operation, assuming that a potential difference necessary for determining the read data from the selected memory cell 20 is $V_O$, the potential difference between the local buses 5-1 and 5-2 (selected bit line pair BL1 and BL1⁻) is just required to become $V_O$. Therefore, the period of time during which the local buses 5-1 and 5-2 and the selected bit line pair BL1 and BL1⁻ are electrically connected with each other need not be as long as that in the write operation.

Therefore, a certain condition is considered. Under the condition, not only a read time necessary for reading a data from the selected memory cell 20 at the time of the read operation can be ensured but also speeding-up can be achieved.

More specifically, the setting condition is as follows. Let us consider a case where a period of time during which the selection signal YSW1 "H" is output in the read operation is "t1". Also, a period of time necessary for the potential difference between the local buses 5-1 and 5-2 (selected bit line pair BL1 and BL1⁻) to become $V_O$ is "t2". A period of time during which the selection signal YSW1 "H" is output in the write operation is "t3". A potential difference V is larger than the potential difference $V_O$. A predetermined set potential of the dummy local bus 10 is "Vst". In this case, the time t1 and the predetermined set potential Vst are so set as to satisfy the following relational expressions:

$$t2 < t1 < t3;$$

$$Vst = VDD - V; \text{and}$$

$$V > V_O.$$

Moreover, a capacitance of the dummy local bus 10 is designed such that the potential of the dummy local bus 10 decreases from the potential VDD to the predetermined set potential Vst in the above-mentioned period of time t1 in the read operation when the dummy local bus 10 is grounded. A means for achieving such the capacitance of the dummy local bus 10 with respect to each memory block 1 is arbitrary. For example, such the capacitance can be achieved by accordion-folding each dummy local bus 10.

A signal supplied to the input of the NAND circuit 41 from the dummy local bus 10 (refer to FIGS. 6A and 6B) is a dummy local bus signal. The predetermined set potential Vst is used for determining a level of the dummy local bus signal. In a case where the potential of the dummy local bus 10 is equal to or more than the predetermined set potential Vst, the level of the dummy local bus signal is the high level "H". On the other hand, in a case where the potential of the dummy local bus 10 is less than the predetermined set potential Vst, the level of the dummy local bus signal is the low level "L".

The read operation will be described below in detail. First, the memory block 1-1 out of the plurality of memory blocks 1-1 to 1-N is specified.

A decoded row address specifies the word line WL1 out of the plurality of word lines WL1 to WLm in the memory block 1-1. In this case, the selected word line WL1 is supplied with a word line selection signal. At this time, a level of the word line selection signal is the high level "H".

At the same time, a decoded row address specifies the bit line pair BL1 and BL1⁻ out of the plurality of bit line pairs BL1 and BL1⁻, . . . , BL8 and BL8⁻ in the memory block 1-1. In this case, the sense amplifier 3-1 that is provided associated with the selected bit line pair BL1 and BL1⁻ among the plurality of sense amplifiers 3-1 to 3-8 in the memory block 1-1 is supplied with the enable signal SAE. At this time, a level of the enable signal SAE is the high level "H".

Here, the decoded row address is supplied as the signals YP1 to YP8 to the driver 9 of the memory block 1-1. For example, the signals YP1 to YP8 represent 1, 0, 0, 0, 0, 0, 0 and 0, respectively. That is, a level of the signal YP1 among the signals YP1 to YP8 is the high level "H", and levels of the other signals are the low level "L". The driver 9 supplies the selection signal YSW1 "H" to the gates of the selected transistors 4-1a and 4-1b that are provided associated with the selected bit line pair BL1 and BL1⁻ among the plurality of transistors 4-1a, 4-1b, . . . , 4-8a and 4-8b in the memory block 1-1. At this time, a level of the selection signal YSW1 is the high level "H".

More specifically, the signal YP1 "H" is supplied to the one input of the NAND circuit 41 of the control circuit 11-1 of the driver 9. At this time, the potential of the dummy local bus 10 is more than the predetermined set potential Vst, and thus the level of the dummy local bus signal supplied from the dummy local bus 10 to the other input of the NAND circuit 41 is the high level "H". In response to the signal YP1 "H" and the dummy local bus signal "H", the control circuit 11-1 supplies the selection signal YSW1 "H" to the gates of the selected transistors 4-1a and 4-1b and the OR circuit 45 of the control circuit 11-5.

The N-type MOSFET 35 of the sense amplifier 3-1 is turned ON in response to the enable signal SAE "H". The selected transistors 4-1a and 4-1b are turned ON in response to the selection signal YSW1 "H", and thus the selected bit line pair BL1 and BL1⁻ and the local buses 5-1 and 5-2 are electrically connected with each other. At this time, a data is read out from the selected memory cell 20 that is connected to the selected word line WL1 and one bit line of the selected bit line pair BL1 and BL1⁻, and a potential difference is generated between the selected bit line pair BL1 and BL1⁻. The selected sense amplifier 3-1 supplies the potential difference to the local buses 5-1 and 5-2 through the selected transistors 4-1a and 4-1b. The data amplifier 6 supplies the potential difference supplied to the local buses 5-1 and 5-2 to the bus 7. The data input/output circuit 8 outputs, as a read data, the potential difference supplied to the bus 7.

Meanwhile, the OR circuit 45 of the control circuit 11-5 outputs a high level signal "H" in response to the selection signal YSW1 "H". In response to the output signal "H" from the OR circuit 45, the transistor 46 of the control circuit 11-5 is turned ON and thus the dummy local bus 10 is grounded. Therefore, the potential of the dummy local bus 10 is gradually decreased from the precharged potential VDD.

When the potential of the dummy local bus 10 becomes lower than the predetermined set potential Vst, the level of the dummy local bus signal that is supplied from the dummy local bus 10 to the other input of the NAND circuit 41 becomes the low level "L". In this case, the control circuit 11-1 sets the level of the selection signal YSW1 to the low level "L", in response to the signal YP1 "H" and the dummy local bus signal "L". That is, the control circuit 11-1 stops outputting the selection signal YSW1 "H".

Next, the level of the enable signal SAE is switched from the high level "H" to the low level "L". Also, the level of the word line selection signal is switched from the high level "H" to the low level "L". At this time, the local buses 5-1 and 5-2 are precharged to the potential VDD.

Also, the level of the precharge signal PRE is switched from the high level "H" to the low level "L". In response to the precharge signal PRE "L", the transistor 48 of the control circuit 11-5 is turned ON and thus the dummy local bus 10 is precharged to the potential VDD. At the next read operation, the level of the precharge signal PRE is switched from the low level "L" to the high level "H". In response to the precharge signal PRE "H", the transistor 48 of the control circuit 11-5 is turned OFF.

Next, the write operation will be described below in detail. First, the memory block 1-1 out of the plurality of memory blocks 1-1 to 1-N is specified.

A decoded row address specifies the word line WL1 out of the plurality of word lines WL1 to WLm in the memory block 1-1. In this case, the selected word line WL1 is supplied with a word line selection signal. At this time, a level of the word line selection signal is the high level "H".

At the same time, a decoded row address specifies the bit line pair BL1 and BL1⁻ out of the plurality of bit line pairs BL1 and BL1⁻, ..., BL8 and BL8⁻ in the memory block 1-1. Here, the decoded row address is supplied as the signals YP1 to YP8 to the driver 9 of the memory block 1-1. For example, the signals YP1 to YP8 represent 1, 0, 0, 0, 0, 0, 0 and 0, respectively. That is, a level of the signal YP1 among the signals YP1 to YP8 is the high level "H", and levels of the other signals are the low level "L". The driver 9 supplies the selection signal YSW1 "H" to the gates of the selected transistors 4-1a and 4-1b that are provided associated with the selected bit line pair BL1 and BL1⁻ among the plurality of transistors 4-1a, 4-1b, ..., 4-8a and 4-8b in the memory block 1-1. At this time, a level of the selection signal YSW1 is the high level "H".

The selected transistors 4-1a and 4-1b are turned ON in response to the selection signal YSW1 "H", and thus the selected bit line pair BL1 and BL1⁻ and the local buses 5-1 and 5-2 are electrically connected with each other.

The data input/output circuit 8 supplies a write data to the bus 7. The data amplifier 6 supplies the write data supplied to the bus 7 to the selected bit line pair BL1 and BL1⁻ through the local buses 5-1 and 5-2 and the selected transistors 4-1a and 4-1b. At this time, the write data is written to a selected memory cell 20 connected to the selected word line WL1 and one bit line (e.g., the bit line BL1) of the selected bit line pair BL1 and BL1⁻.

Next, the level of the word line selection signal is switched from the high level "H" to the low level "L". At this time, the local buses 5-1 and 5-2 are precharged to the potential VDD.

According to the semiconductor memory device of the present embodiment, speeding-up can be achieved in the read operation (first effect), even in the case of the eDRAM configuration. The reason is as follows.

In the case of the eDRAM, the length of the local bus is greater than that of the DRAM. Therefore, the dummy local bus 10 is provided in each of the plurality of memory blocks 1-1 to 1-N, and the dummy local bus 10 is precharged to the potential VDD. In the read operation, the selection signal YSW1 "H" is output to the selected transistors 4-1a and 4-1b of the specified memory block 1-1, and also the ground potential GND is supplied to the dummy local bus 10 of the specified memory block 1-1. Here, let us consider a case where the potential difference necessary for determining the read data from the selected memory cell 20 is $V_O$. In this case, the potential difference between the local buses 5-1 and 5-2 just needs to be $V_O$. Therefore, when the potential of the dummy local bus 10 is decreased from the potential VDD to the predetermined set potential Vst (Vst=VDD−V, V>$V_O$) in the period of time t1 (t2<t1<t3), the outputting of the selection signal YSW1 "H" is stopped. In this manner, according to the semiconductor memory device of the present embodiment, the period of time during which the local buses 5-1 and 5-2 and the selected bit line pair BL1 and BL1⁻ are electrically connected with each other in the read operation is shortened as compared with a case of the write operation. Thus, speeding-up can be achieved in a read operation, even in the case of the eDRAM configuration.

Moreover, according to the semiconductor memory device of the present embodiment, power consumption on charging/discharging the local buses 5-1 and 5-2 in the read operation can be reduced (second effect). The reason is as follows.

Figure 8:
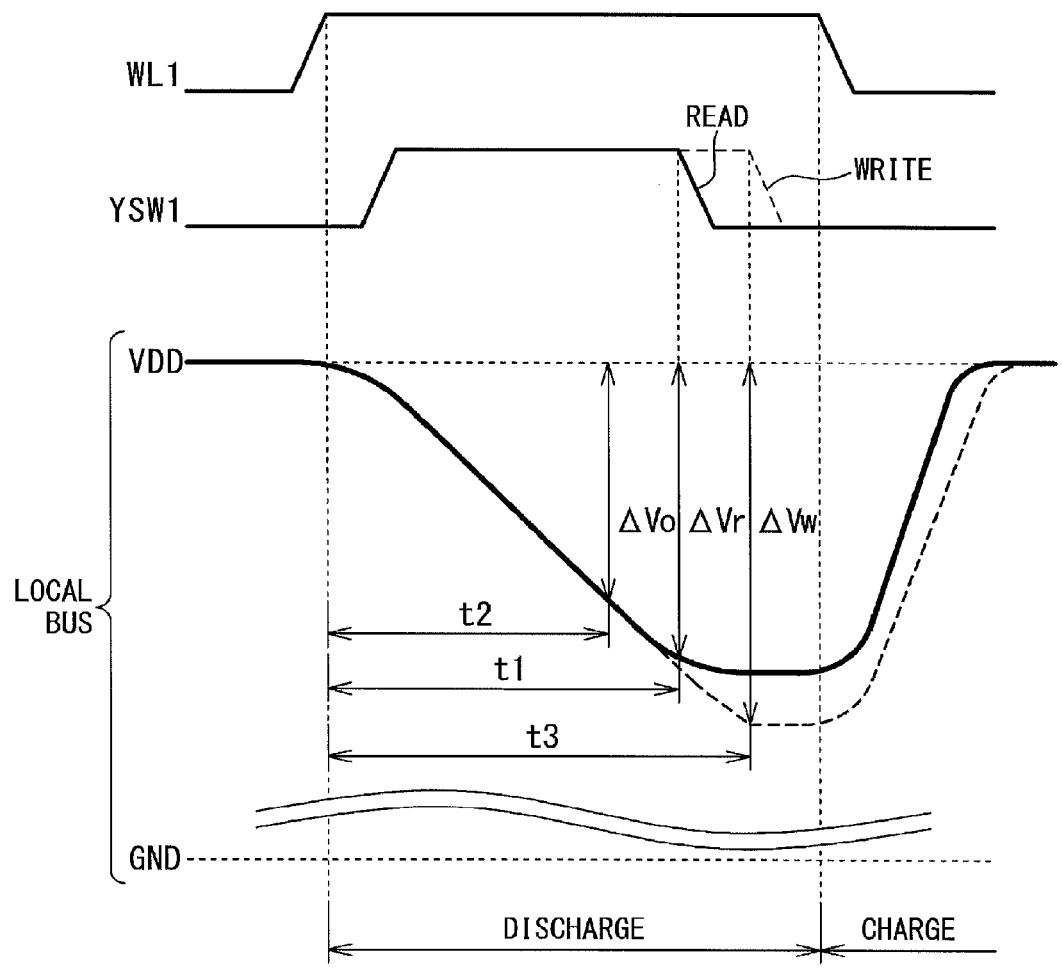
FIG. 8 is a diagram for describing an effect of the semiconductor memory device according to the embodiment of the present invention.

In the read operation, as shown in FIG. 8, the local buses 5-1 and 5-2 are discharged to generate the potential difference $V_O$ that is necessary for determining the read data from the selected memory cell 20. After that, the local buses 5-1 and 5-2 are precharged to the potential VDD. In a case where the period of time during which the local buses 5-1 and 5-2 and the selected bit line pair BL1 and BL1⁻ are electrically connected with each other in the read operation is the same as that in the write operation, the potential difference between the local buses 5-1 and 5-2 due to the discharging becomes equal to a potential difference Vw generated in a period from the start of the read operation to the stop of the output of the selection signal YSW1 "H", i.e., the charging/discharging is performed just by an amount of the potential difference Vw. On the other hand, in the case where the period of time during which the local buses 5-1 and 5-2 and the selected bit line pair BL1 and BL1⁻ are electrically connected with each other in the read operation is shorter than that in the write operation, the potential difference between the local buses 5-1 and 5-2 due to the discharging becomes equal to a potential difference Vr (Vr<Vw) generated in a period from the start of the read operation to the stop of the output of the selection signal YSW1 "H", i.e., the charging/discharging is performed just by an amount of the potential difference Vr. The potential difference Vr is smaller than the potential difference Vw. Therefore, according to the semiconductor memory device of the present embodiment, the power consumption on charging/discharging the local buses 5-1 and 5-2 in the read operation can be reduced, by setting the period of time during which the local buses 5-1 and 5-2 and the selected bit line pair BL1 and BL1⁻ are electrically connected with each other in the read operation shorter than that in the write operation.

In the above-described embodiment of the present invention, the capacitance of the dummy local bus 10 is designed such that the potential of the dummy local bus 10 decreases from the potential VDD to the predetermined set potential Vst in the above-mentioned period of time t1 in the read operation when the dummy local bus 10 is grounded. By adjusting the capacitance of the dummy local bus 10 depending on specifications (ambient temperature, voltage) and manufacturing variability, the minimum power consumption necessary for charging/discharging the local buses 5-1 and 5-2 can be determined. That is, the second effect can be achieved in addition to the first effect.

Figure 9:
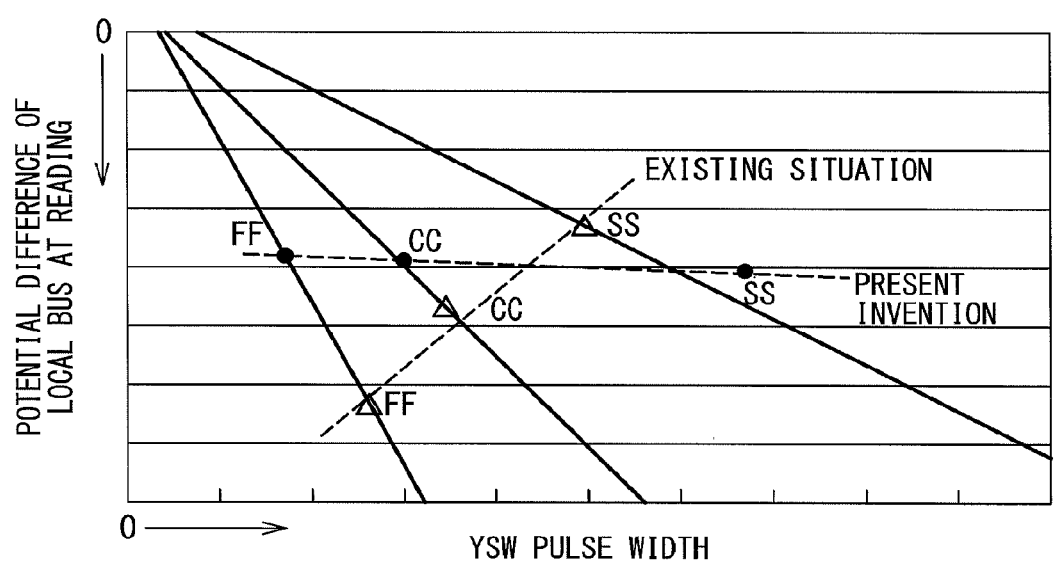
FIG. 9 is an example where a relationship between a selection signal YSW1"H" (YSW pulse width) and a potential difference between the local buses 5-1 and 5-2 upon the read operation is compared between the case where the performance of elements including transistors is too high (FF) and the case where the performance is too low (SS), in the semiconductor memory device according to the embodiment of the present invention.

Also, in the semiconductor memory device according to the embodiment of the present invention, by adjusting the capacitance of the dummy local bus 10, the potential difference between the local buses 5-1 and 5-2 is not affected by the performance of elements. FIG. 9 shows an example where a relationship between the selection signal YSW1 "H" (YSW pulse width) and the potential difference between the local buses 5-1 and 5-2 in the read operation is compared between the case where the performance of elements including transistors is too high (FF) and the case where the performance is too low (SS). In the case of a conventional semiconductor memory device (existing situation), the potential difference between the local buses 105-1 and 105-2 has a variation depending on the performance of elements. However, in the case of the semiconductor memory device according to the embodiment of the present invention, the potential difference between the local buses 5-1 and 5-2 is stable regardless of the performance of elements, because the dummy local bus 10 is used.

Furthermore, according to the semiconductor memory device of the present embodiment, noise on the local buses 5-1 and 5-2 can be reduced. The reason is as follows.

An amount of noise occurring on the local buses 5-1 and 5-2 due to the charging/discharging of the local buses 5-1 and 5-2 is proportional to a width of the local bus 5-1, 5-2 (local bus width). However, in the case of the eDRAM, the local bus width is larger than that in the case of the DRAM, and hence the noise also is increased as compared with the case of the DRAM. Whereas, the amount of noise is proportional also to the power consumption. Therefore, by reducing the power consumption on charging/discharging the local buses 5-1 and 5-2, the noise on the local buses 5-1 and 5-2 can be reduced.

In the case of the eDRAM, the number of memory cells per bit line is set smaller in order to increase an operating speed of the memory block, and thus a current to the sense amplifier tends to be smaller. Therefore, to reduce the power consumption is effective in design of a system LSI.

Note that, in the present embodiment as described above, the capacitance of the dummy local bus 10 is adjusted in advance for each of the memory blocks 1-1 to 1-N, as the setting condition. However, a parasitic capacitance depending on the length and layout of the local buses 5-1 and 5-2 may affect the variation in the potentials of the local buses 5-1 and 5-2. In order to replicate the variation in the potentials of the local buses 5-1 and 5-2, the same material is preferably used for the dummy local bus 10 and the local buses 5-1 and 5-2, and the dummy local bus 10 is preferably arranged in parallel to the local buses 5-1 and 5-2. In this manner, the capacitance of the dummy local bus 10 is adjusted in consideration of the material, length, arrangement and the like.

Figure 10:
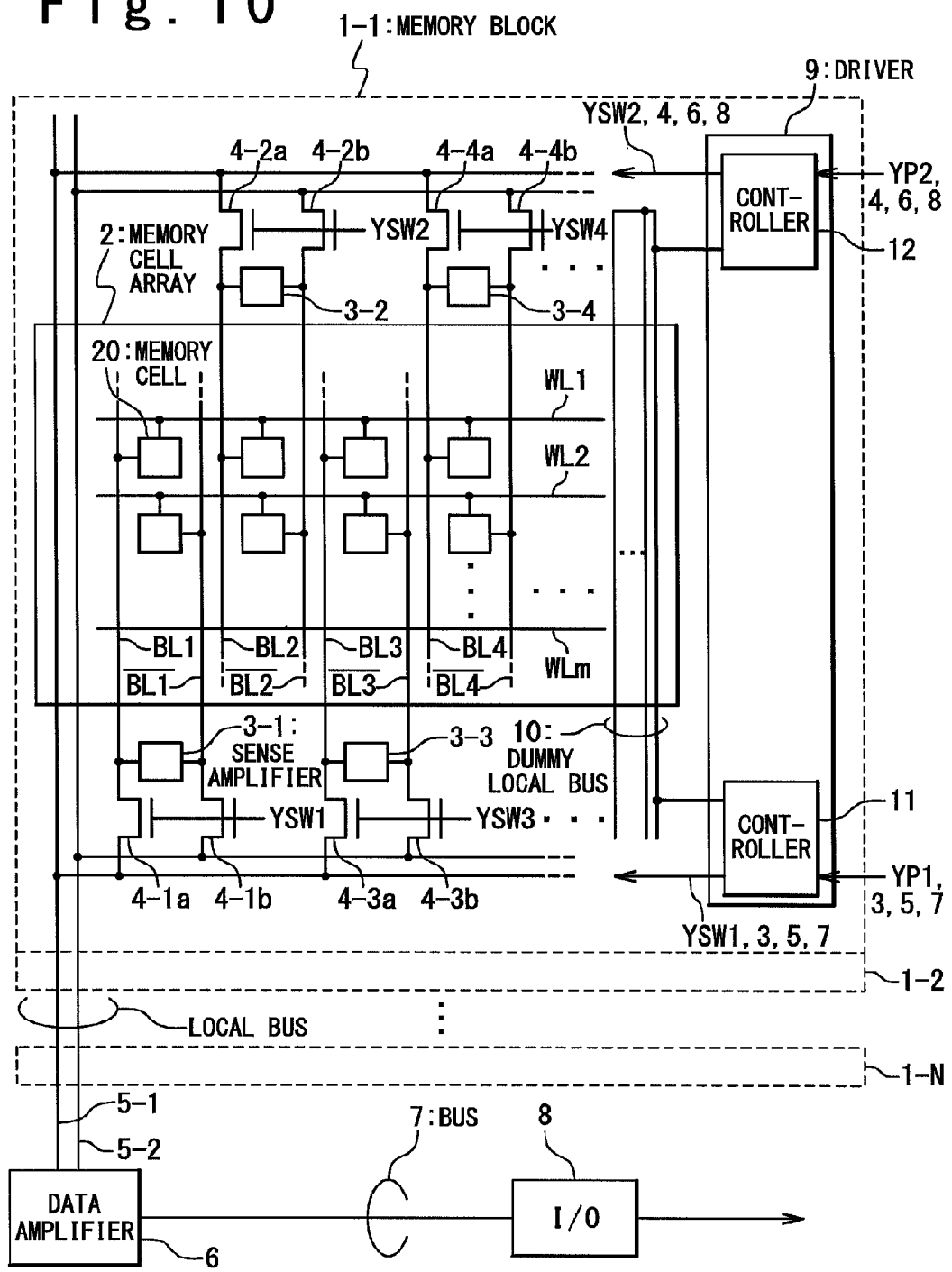
FIG. 10 illustrates another configuration of the semiconductor memory device according to the embodiment of the present invention.

If the setting condition cannot be satisfied by providing a single dummy local bus 10, the number of the dummy local bus 10 may be increased as shown in FIG. 10. In other words, the capacitance and/or the number of the dummy local bus 10 is designed such that the setting condition is satisfied with respect to each of the plurality of memory blocks 1-1 to 1-N. The number can be selected with respect to each of the memory blocks. A means for achieving the capacitance of the dummy local bus 10 with respect to each memory block is arbitrary. For example, the capacitance can be achieved by accordion-folding each dummy local bus 10.

Figure 11A:
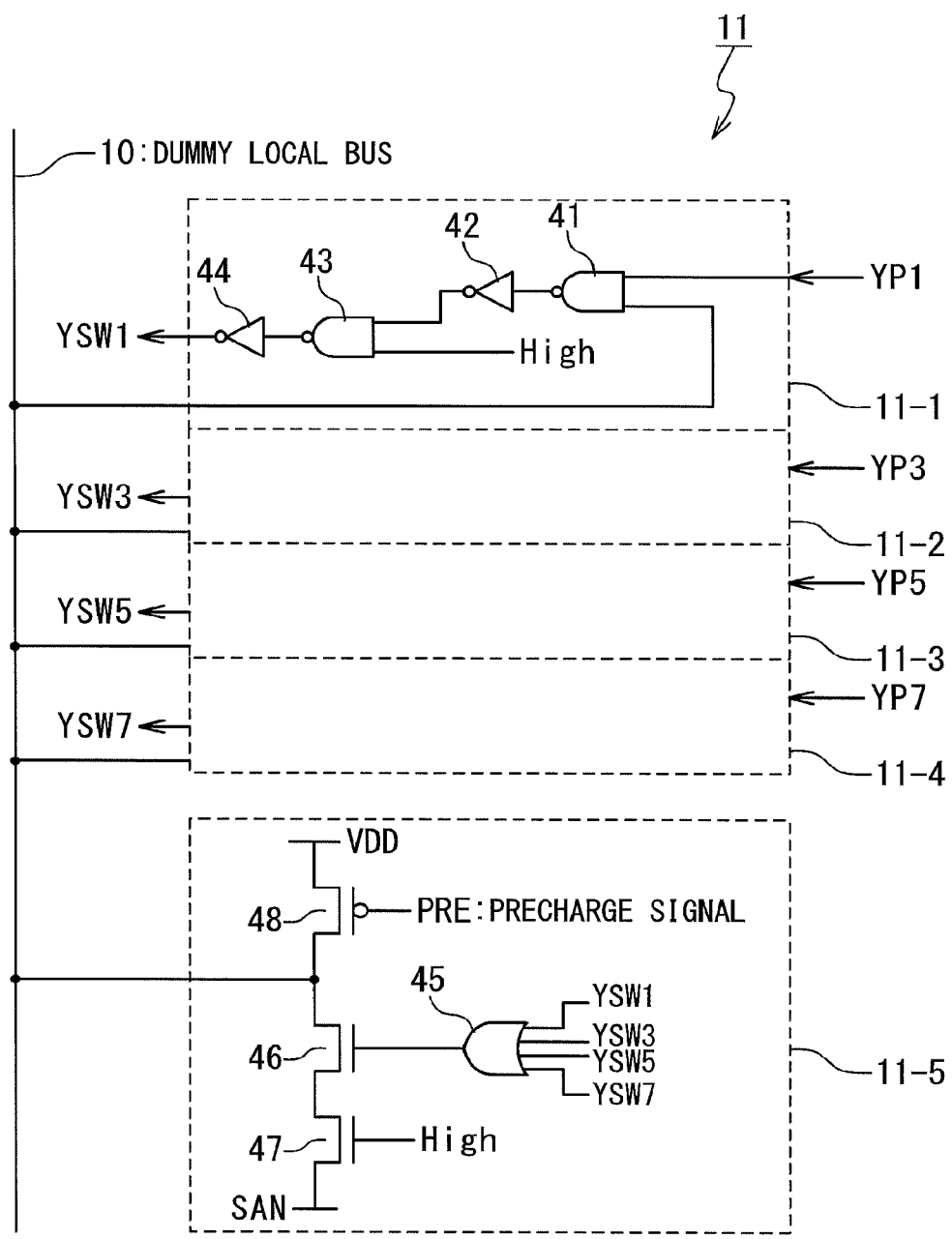
FIG. 11A illustrates a connection relationship between, in each memory block (e.g., memory block 1-1) in FIG. 4, a controller 11 and a dummy local bus 10, in a semiconductor memory device according to another embodiment of the present invention.
Figure 11B:
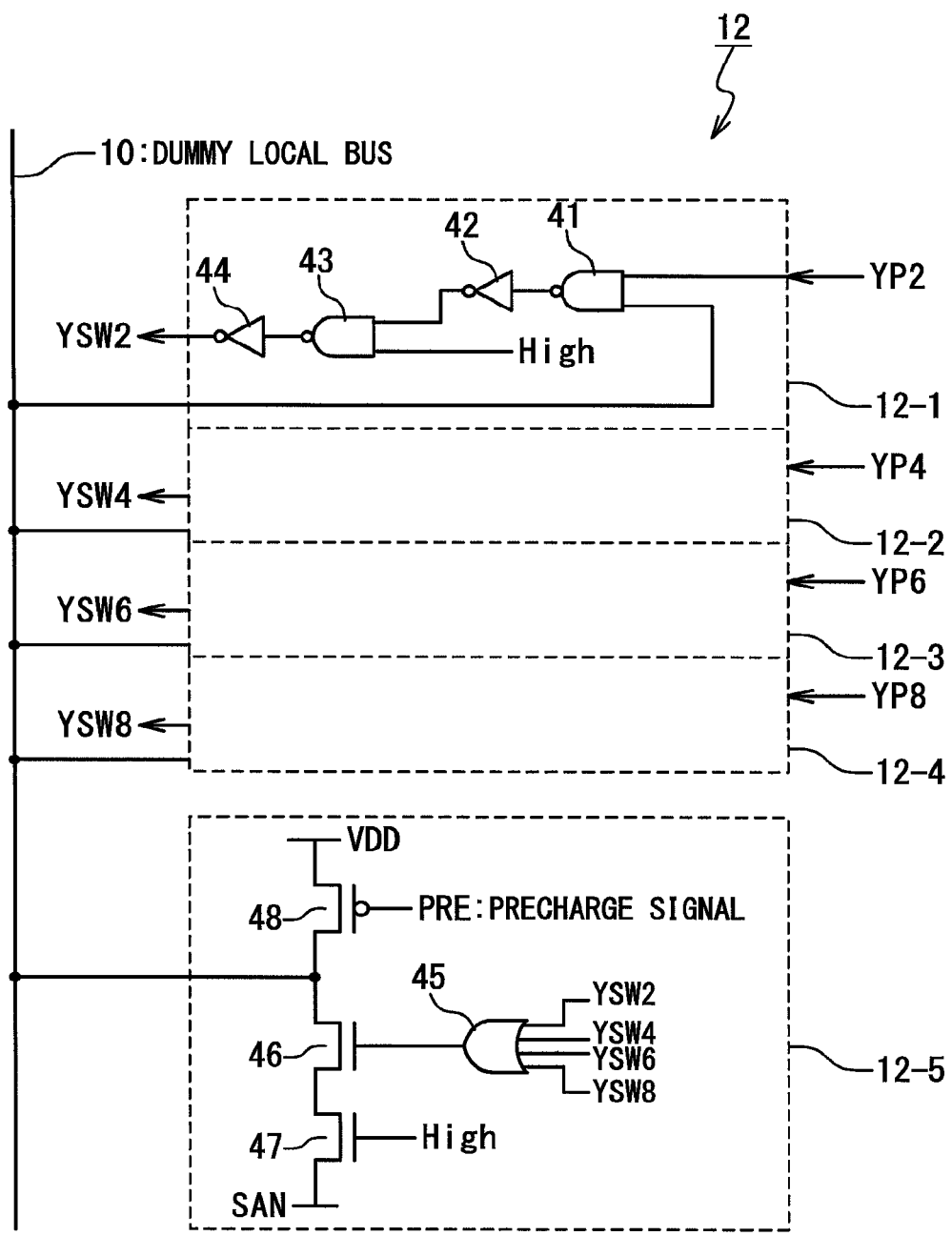
FIG. 11B illustrates a connection relationship between, in each memory block (e.g., memory block 1-1) in FIG. 4, a controller 12 and a dummy local bus 10, in the semiconductor memory device according to the another embodiment of the present invention.

Moreover, in the present embodiment, in a case where the transistor 47 is of the same type as the N-type transistors 32 and 34 within the flip-flop of each sense amplifier 3, a potential supplied to the source of the transistors 47 of the control circuits 11-5 or 12-5 may be made equal to the potential SAN used in each sense amplifier 3, as illustrated in FIG. 11A or 11B, in consideration of a current flowing through the flip-flop (P-type MOSFETs 31 and 33 and N-type MOSFETs 32 and 34) of each sense amplifier 3.

It is apparent that the present invention is not limited to the above embodiments and may be modified and changed without departing from the scope and spirit of the invention.

What is claimed is:

1. A semiconductor memory device comprising:
  a plurality of memory blocks; and
  a local bus coupled to said plurality of memory blocks,
  wherein each of said plurality of memory blocks comprises:
    a memory cell array in which memory cells are arranged in a matrix form;
    a plurality of bit line pairs arranged in a column direction of said memory cell array;
    a plurality of switches coupled between said plurality of bit line pairs and said local bus, said switches being controlled by a selection signal;
    a dummy local bus controlled by a control signal;
    a first control circuit that couples to said dummy local bus and provides said selection signal; and
    a second control circuit that receives a plurality of said selection signals and provides said control signal.

2. The semiconductor memory device according to claim 1, wherein said memory cell array is arranged between two of said switches.

3. The semiconductor memory device according to claim 1, further comprising a sense amplifier circuit,
  wherein said sense amplifier is arranged between said switch and said memory cell array.

4. The semiconductor memory device according to claim 1, wherein said dummy local bus is arranged in parallel to said local bus and is arranged in a peripheral area of said memory cell array.

5. The semiconductor memory device according to claim 3, wherein said second control circuit receives a source voltage of said sense amplifier.

6. The semiconductor memory device according to claim 3, wherein said second control circuit has two transistors, said two transistors being serially connected each other.

7. The semiconductor memory device according to claim 6, wherein said one of said transistors is same type as N-type transistor within flipflop circuit of said sense amplifier.

* * * * *